United States Patent
Girard

(10) Patent No.: US 6,751,843 B2
(45) Date of Patent: Jun. 22, 2004

(54) METHOD FOR IMPROVED STATIC ATTITUDE OF HEAD SUSPENSION ASSEMBLIES WITH ELECTRICAL INTERCONNECTS

(75) Inventor: Mark T. Girard, Hutchinson, MN (US)

(73) Assignee: Applied Kinetics, Inc., Hutchinson, MN (US)

( * ) Notice: Subject to any disclaimer, the term of this patent is extended or adjusted under 35 U.S.C. 154(b) by 25 days.

(21) Appl. No.: 09/803,267

(22) Filed: Mar. 9, 2001

(65) Prior Publication Data

US 2002/0127838 A1 Sep. 12, 2002

(51) Int. Cl.⁷ .................. G11B 5/127; H04R 31/00
(52) U.S. Cl. .................. 29/603.03; 29/603.01; 29/603.04; 29/603.07; 29/603.09; 360/254.5; 360/245.8
(58) Field of Search ............... 29/592.1, 603.01, 29/603.04, 603.06, 603.07, 603.09, 603.03; 360/234.5, 245.8

(56) References Cited

U.S. PATENT DOCUMENTS

| | | | | |
|---|---|---|---|---|
| 5,391,842 A | * | 2/1995 | Bennin et al. | 174/260 |
| 5,687,479 A | * | 11/1997 | Bennin et al. | 29/885 |
| 5,864,445 A | * | 1/1999 | Bennin et al. | 360/245.9 |
| 6,249,404 B1 | * | 6/2001 | Doundakov et al. | 360/245.4 |

* cited by examiner

Primary Examiner—A. Dexter Tugbang
Assistant Examiner—Paul Kim
(74) Attorney, Agent, or Firm—Kagan Binder, PLLC

(57) ABSTRACT

The present invention provides a method for improving the static attitude of a head suspension assembly by improving the manufacture of electrical interconnects by providing a laterally directed tension on the electrical interconnect during manufacture, thereby substantially inhibiting deformation of the gimbal region of the interconnect and the creation of non-planar slider standoffs.

8 Claims, 6 Drawing Sheets

METHOD FOR IMPROVED STATIC ATTITUDE OF HEAD SUSPENSION ASSEMBLIES WITH ELECTRICAL INTERCONNECTS

BACKGROUND OF THE INVENTION

Most personal computers today utilize direct access storage devices (DASD) or rigid disk drives for data storage and retrieval. Present disk drives include a disk rotated at high speeds and a read/write head that, in industry parlance, "flies" a microscopic distance above the disk surface. The disk includes a magnetic coating that is selectively magnetizable. As the head flies over the disk, it "writes" information, that is, data, to the hard disk drive by selectively magnetizing small areas of the disk; in turn, the head "reads" the data written to the disk by sensing the previously written selective magnetizations. The read/write head is affixed to the drive by a suspension assembly and electrically connected to the drive electronics by an electrical interconnect. This structure (suspension, electrical interconnect, and read/write head) is commonly referred to in the industry as a Head Gimbal Assembly, or HGA.

More specifically, currently manufactured and sold read/write heads include an inductive write head and a magnetoresistive (MR) read head or element or a "giant" magnetoresistive (GMR) element to read data that is stored on the magnetic media of the disk. The write head writes data to the disk by converting an electric signal into a magnetic field and then applying the magnetic field to the disk to magnetize it. The MR read head reads the data on the disk as it flies above it by sensing the changes in the magnetization of the disk as changes in the voltage or current of a current passing through the MR head. This fluctuating voltage in turn is converted into data. The read/write head, along with a slider, is disposed at the distal end of an electrical interconnect/suspension assembly.

An exploded view of a typical electrical interconnect/suspension assembly is shown in FIG. 1, which illustrates several components including a suspension A and an interconnect B. It will be understood that the actual physical structures of these components may vary in configuration depending upon the particular disk drive manufacturer and that the assembly shown in FIG. 1 is meant to be illustrative of the prior art only. Typically, the suspension A will include a base plate C, a radius (spring region) D, a load beam E, and a flexure F. At least one tooling discontinuity 70 G may be included. An interconnect B may include a base H, which may be a synthetic material such as a polyimide, that supports typically a plurality of electrical traces or leads I of the interconnect. The electrical interconnect B may also include a polymeric cover layer that encapsulates selected areas of the electrical traces or leads I.

Stated otherwise, suspension A is essentially a stainless steel support structure that is secured to an armature in the disk drive. The read/write head is attached to the tip of the suspension A with adhesive or some other means. The aforementioned electrical interconnect is terminated to bond pads on the read/write head and forms an electrical path between the drive electronics and the read and write elements in the read/write head. The electrical interconnect is typically comprised of individual electrical conductors supported by an insulating layer of polyimide and typically covered by a cover layer.

As mentioned previously, the slider "flies" only a microscopic distance—the "fly height"—above the spinning media disk. Control of fly height is critical for the operation of a disk drive. If the fly height is too large, the read/write head will not be able to read or write data, and if it is to small, the slider can hit the media surface, or crash, resulting the permanent loss of stored data. As such, the fly height of the slider is determined in much part by the characteristics of the head suspension assembly to which it is mounted. The head suspension imparts a vertical load, commonly referred to as "gram load", on the slider, normal to the surface of the disk, in order to oppose the "lift" forces created by the air passing between the slider and the spinning disk. As a result, head suspension assemblies are manufactured with a very precise gram load, typically with a tolerance of ±0.2 grams. Another head suspension assembly characteristic that has a significant effect upon the fly height of a slider, is referred to as "static attitude". Static attitude is the angular attitude of the gimbal to which the slider is mounted. Typically, head suspension assemblies are manufactured with tolerances for static attitude approaching ±30 arc-minutes.

Successful reading or writing of data between the head and the spinning media also requires that the head be precisely positioned directly above the location on the disk to which data is to be written or read. As such, great care is taken to design and manufacture head suspension assemblies so as to optimize the suspension's vibrational, or resonant, performance.

There are three basic configurations of electrical interconnect/suspension assemblies that are currently utilized in the disk drive industry. With the first, a Trace Suspension Assembly, or TSA, the electrical interconnect is fabricated integrally with the flexure. The TSA flexure/interconnect is fabricated by selectively removing material from a laminate of stainless steel, polyimide, and copper. The TSA flexure/interconnect is then attached to a loadbeam, typically with one or more spot welds between the stainless steel layer of the TSA flexure/interconnect and the stainless steel of the loadbeam.

Another interconnect configuration, termed CIS, is very similar to TSA in that the CIS interconnect is also fabricated integrally with the flexure. However, the CIS interconnect/flexure is fabricated with "additive" processes, rather than "subtractive" processes. The CIS interconnect/flexure is attached to a load beam in much the same manner as the TSA flexures and conventional flexures are, with one or more spot welds between the stainless steel of the flexure and that of the loadbeam.

The last interconnect configuration that is utilized today by disk drive assemblers is essentially a flexible circuit. The flexible circuit consists of a base polymer, typically a polyimide, which supports copper traces, or leads. In this case, the interconnect is fabricated independently from the flexure, and is later adhesively attached to a conventional head suspension assembly, to form a Flex Suspension Assembly, or FSA.

The attachment of conventional flexures to load beams with spot welds has been practiced for years throughout the head suspension industry and is well understood. Thus, the attachment of a CIS or TSA interconnect/flexure to a loadbeam utilizes existing techniques, and does not present any significant challenges for manufacturers of head suspension assemblies. On the other hand, adhesive attachment of flexible circuits to conventional head suspension assemblies results in a number of issues which the manufacturer of head suspension assemblies must address. For example, the conventional suspension to which the electrical interconnect is attached, is manufactured with great care to ensure that the gimbal is at the prescribed static attitude. But when the electrical interconnect is bonded to the conventional suspension assembly, the static attitude of the gimbal is altered relative to the angular attitude of the gimbal region of the electrical interconnect, thereby increasing the static attitude variation and changing the static attitude average of the completed head suspension assembly/electrical interconnect.

While FSA is significantly cheaper than it's counterparts, namely TSA and CIS, the degradation in FSA performance due to the adhesive attachment of the flexible circuit creates a tradeoff between cost and performance that must be considered when comparing the competing technologies.

As such, it is the object of the present invention to eliminate the degradation in FSA performance associated with the adhesive attachment of the flexible circuit to the head suspension assembly. More specifically, it is the object of the present invention to minimize the change in static attitude of the gimbal of a head suspension assembly during the adhesive attachment of a flexible circuit to a head suspension assembly.

SUMMARY OF THE INVENTION

It is an object of the present invention to provide a method of producing an electrical interconnect which is attached to a conventional head suspension assembly without significantly affecting the static attitude attributes of the head suspension assembly.

It is an object of the present invention to provide an electrical interconnect which is attached to a conventional head suspension assembly without significantly affecting the static attitude attributes of the head suspension assembly.

The present invention is directed to a head suspension assembly/electrical interconnect that cantilevers a read/write magnetic transducer head adjacent the rotating surface of a disk in a disk drive from an actuator arm of the disk drive, and the method of constructing the head suspension/electrical interconnect assembly. The present invention includes both methods and designs intended to minimize the change of the head suspension gimbal's static attitude resulting from the adhesive attachment of an electrical interconnect, thereby improving the manufacturing yields and performance of the head suspension assembly/electrical interconnect.

The present invention accomplishes the foregoing aims and goals by providing a web out of which the electrical interconnect is formed, the web having at least a bottom layer of a synthetic material supporting a conductive material. The conductive layer is selectively removed to form the electrical leads or traces, thus forming an interconnect blank. Subsequent to the formation of the traces, the bottom support layer is selectively removed, thus forming an interconnect blank that is still attached to the web by a pair of tension tabs composed of the bottom (or substrate) material. These tabs provide a tension directed in a direction angularly disposed to the longitudinal axis of the interconnect blank. The interconnect blank is then severed from the web, with the tension tabs exerting a laterally directed tension, thereby substantially inhibiting deformation of the gimbal region of the interconnect and the creation of non-planar slider standoffs.

The foregoing objects of the invention will become apparent to those skilled in the art when the following detailed description of the invention is read in conjunction with the accompanying drawings and claims. Throughout the drawings, like numerals refer to similar or identical parts.

DETAILED DESCRIPTION OF THE INVENTION

Figure 2:
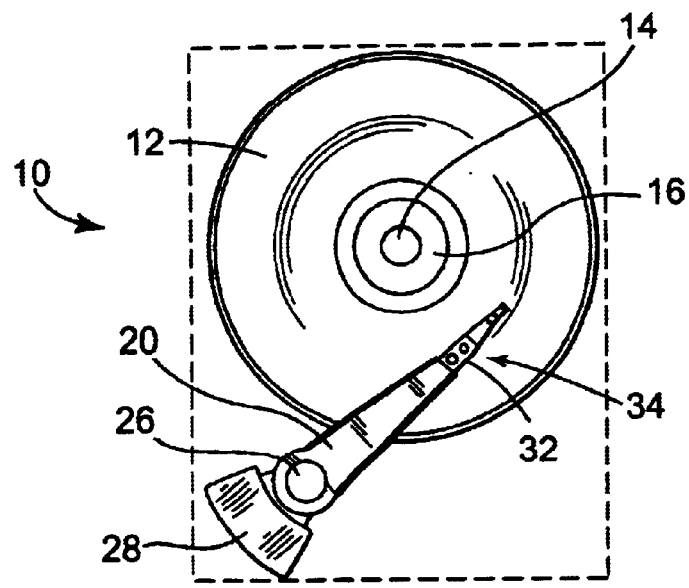
FIG. 2 is a top plan view of a hard disk drive.
Figure 3A:
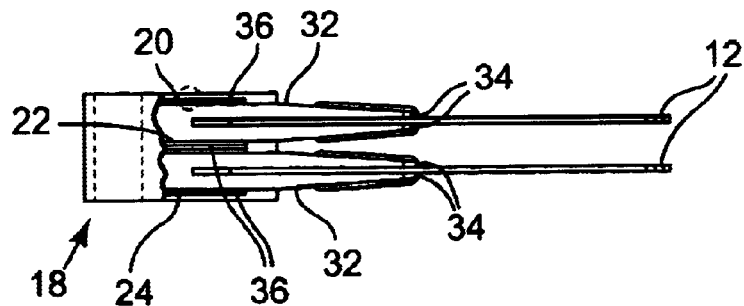
FIG. 3A is a side elevation, partial view of a hard disk drive, such as that shown in FIG. 2.
Figure 3B:
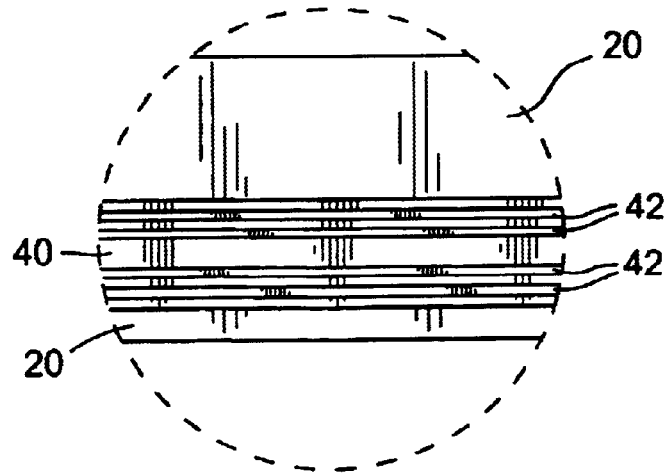
FIG. 3B is an enlarged view of the area shown in the phantom circle in FIG. 3A.

FIGS. 2, 3A, and 3B illustrate a hard disk drive 10 in a top plan, highly schematic view. It will be understood that many of the components found in such a disk drive 10, such as memory cache and the various controllers are not shown in the figure for purposes of clarity. As illustrated, drive 10 includes at least one, and typically several, disks 12 mounted for rotation on a spindle 14, the spindle motor and bearing not being shown for purposes of clarity. A disk clamp 16 is used to position and retain the disk 12 on the spindle 14. The disk drive 10 further includes an "E" block 18, best seen in FIG. 2A. The E block 18 gets its name from its shape as viewed from the side. It will be observed that E block 18 includes a plurality of actuator arms 20, 22, and 24, which are supported for pivotal motion by an actuator pivot bearing 26. A voice coil motor assembly 28 is used to control the pivoting motion of the actuator arms 20–24.

Each actuator arm 20–24 includes a head gimbal assembly 30 comprising a suspension 32, a read/write head/slider 34, and interconnect 36 that extends from the head/slider to the actuator flex. The dashed circle shows an expanded view of the arm 20, which includes a substrate 40 (wherein the bracket indicates the lateral extent of the substrate relative to the actuator arm 20 in this particular embodiment) upon which electrical leads or traces 42 are supported. The electrical conductors 42 are typically copper or copper alloy with a gold plating.

The substrate 40 will substantially underlie the traces 42. Substrate 40 may comprise a synthetic material such as polyimide, which may be of the type sold under the brand name Kapton by I. E. DuPont.

Figure 4:
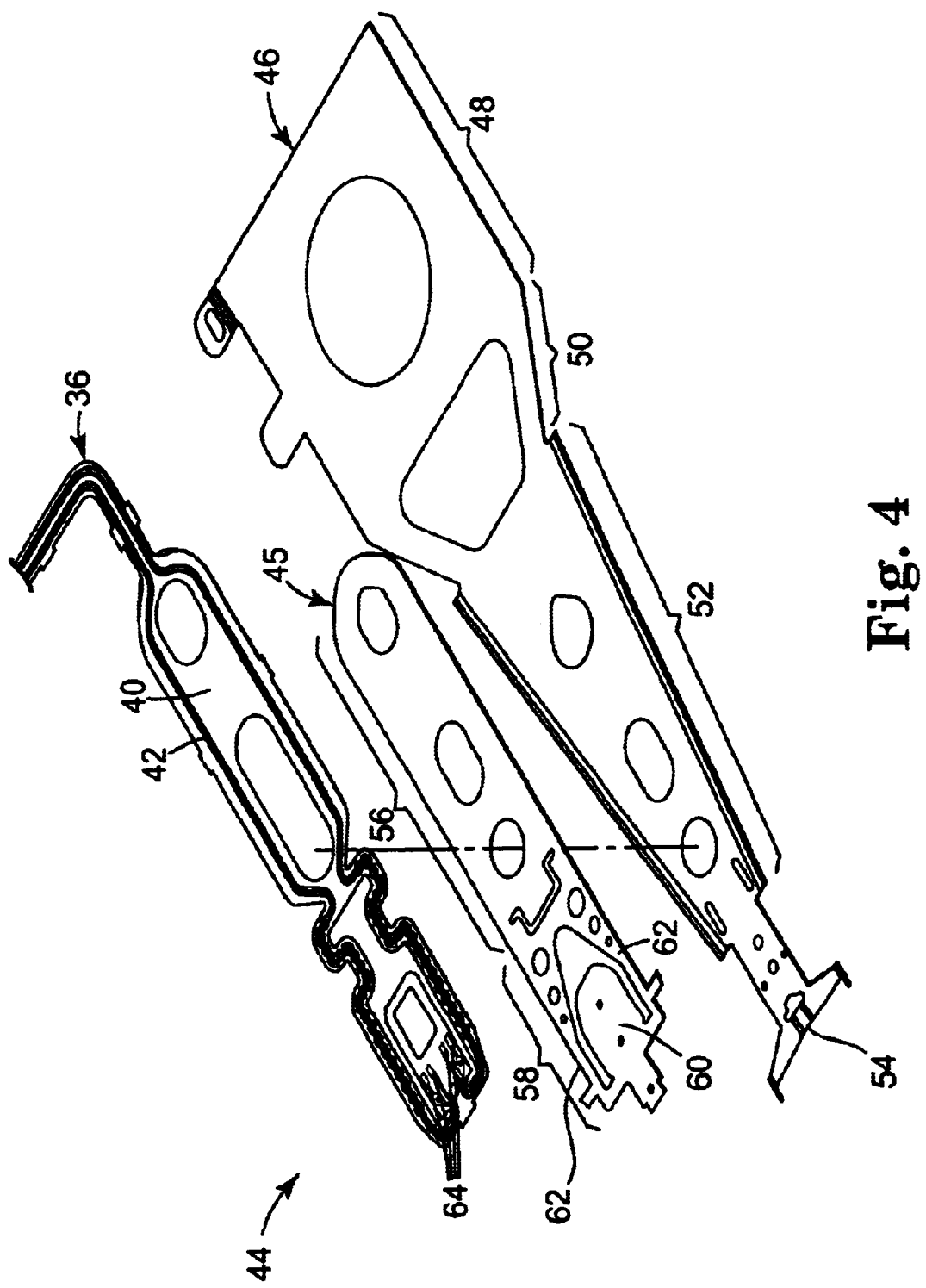
FIG. 4 is an exploded perspective view of a suspension/electrical interconnect.

FIG. 4 is an example of a head suspension/electrical interconnect assembly 44 for which the present invention is intended. Assembly 44 may have varying configurations depending upon the manufacturer. Assembly 44 is comprised of four primary components: electrical interconnect 36, flexure 45, loadbeam 46, and a baseplate (not shown for the purposes of clarity).

The loadbeam 46 can be properly described as having a mounting region 48 (to which a baseplate is mounted), a spring region 50, a load beam body 52, and a loadpoint 54.

Similarly, the flexure 45 is comprised of a flexure body 56 and a gimbal region 58. The flexure body 56 is rigidly affixed to the load beam body 52, typically with one or more spot welds. As such, the gimbal region 58 of the flexure 45 is not rigidly affixed to the loadbeam 46. Within the gimbal region 58 of the flexure 45, there is a support pad, commonly referred to as the tongue 60. The tongue 60 is in point contact with the loadpoint 54, and provides for a mounting surface to which the slider is affixed with adhesive or some other means. The tongue 60 is connected to the flexure body 56 by resilient springs, commonly referred to as flexure arms 62. This construction of flexure 45 and load beam 46 provides for the tongue 60 to pivot, or gimbal, about the loadpoint 54 when a small torque is applied. The flexure 45 and load beam 46 assembly is referred to as a "conventional" suspension assembly. After the electrical interconnect 36 has been applied to a conventional suspension assembly, the assembly will more properly be referred to as a head suspension/electrical interconnect assembly 44.

The electrical interconnect 36, as described previously, generally consists of a base substrate 40, such as polyimide, supporting electrical leads or traces 42. At one end of the electrical interconnect 36 are slider termination pads 64 that form electrical connections to the read/write head. The electrical interconnect 36 may also have an area of substrate that is sandwiched between the flexure tongue 60 and the read/write head slider (not shown in these figures). The electrical interconnect 36 is attached to the conventional suspension assembly such that is rigidly affixed to the suspension assembly in areas proximal to the flexure body 56 and load beam body 52. The electrical interconnect 36 may also be rigidly attached to the flexure tongue 60.

It is desirable to attach the electrical interconnect 36 to the conventional head suspension assembly as described previously, without significantly impacting the performance of the conventional head suspension assembly. Adhesive is used to affix the electrical interconnect 36 to both the load beam body 52/flexure body 56 and flexure tongue 60. If the portion of the electrical interconnect 36 that is affixed to the flexure tongue 60 is not planar with the flexure tongue 60, the static attitude of the flexure tongue 60 will change respective of the relative stiffnesses of the flexure 45 and electrical interconnect 36 and respective of the difference in planar angles of the flexure tongue 60 and electrical interconnect 36. Additionally, the distribution of planar angles of the electrical interconnect 36 serves to increase the distribution of the gimbal static attitude of the head suspension assemblies 44 to which they are attached. As a result, it is advantageous for the planar angles of the region of the electrical interconnect 36 which is bonded to the flexure tongue 60 of the flexure 45 to be consistent from part to part, that is, to have a very tight distribution with little variation. Therefore, factors which impart variability on the planar angles of the electrical interconnect 36 in the area of the electrical interconnect that is bonded to the flexure tongue 60 of the flexure 45 are desirably minimized.

The electrical interconnect 36 is created from a "web" of material by way of subtractive processes, such as etching and blanking. The "web" is generally a comprised of at least one layer of copper and one or more layers of polyimide, or some other polymer. The layers of copper and polyimide are patterned and material is selectively removed to formulate the electrical interconnect 36. This process may include plating, spray coating, etching, developing, exposing, stripping, and curing, without regard for the frequency and order. Variants to this process are obvious and well known to those skilled in the art. Many of the processes, such as stripping and plating, utilized to manufacture the electrical interconnect 36 exert high pressures and loads on the web, thereby imparting significant stresses into the individual electrical interconnects 36. This can result in significant un-wanted yielding or bending of the electrical interconnects 36 if the electrical interconnects 36 are not properly supported in the web. Additionally, near the completion of the electrical interconnect 36 manufacturing process, the individual electrical interconnects are blanked, or sheared, from the web with blanking dies. The blanking process again imparts significant stresses into the web and can result in un-wanted yielding or bending of the electrical interconnects 36. As mentioned earlier, it is advantageous for the electrical interconnect 36, especially the portion of the electrical interconnect that is to be affixed to the flexure tongue 60, to be flat and very consistent within a distribution.

Figure 5:
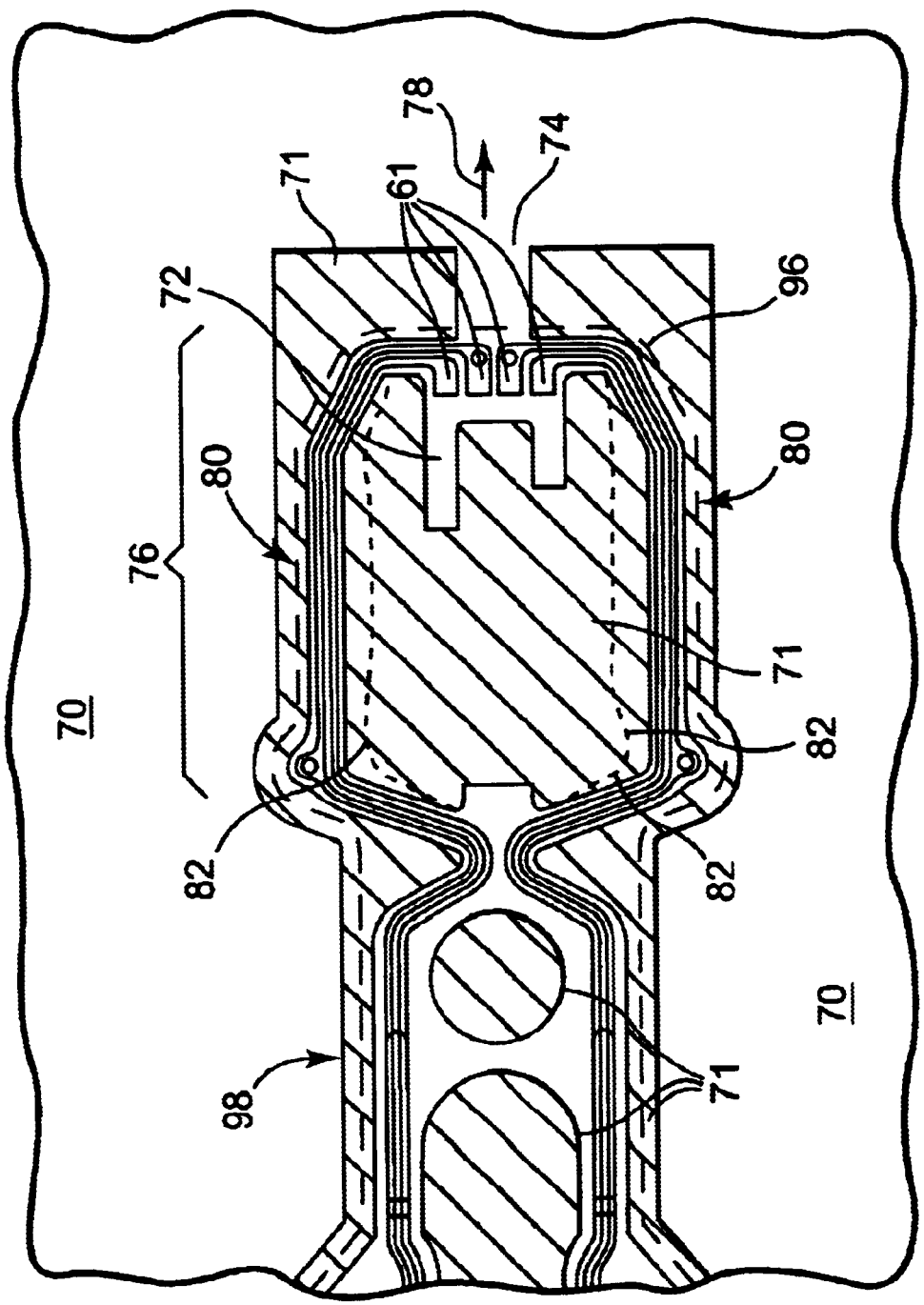
FIG. 5 is an enlarged top plan view of the gimbal region of a standard electrical interconnect before it has been excised from the polyimide web.
Figure 6:
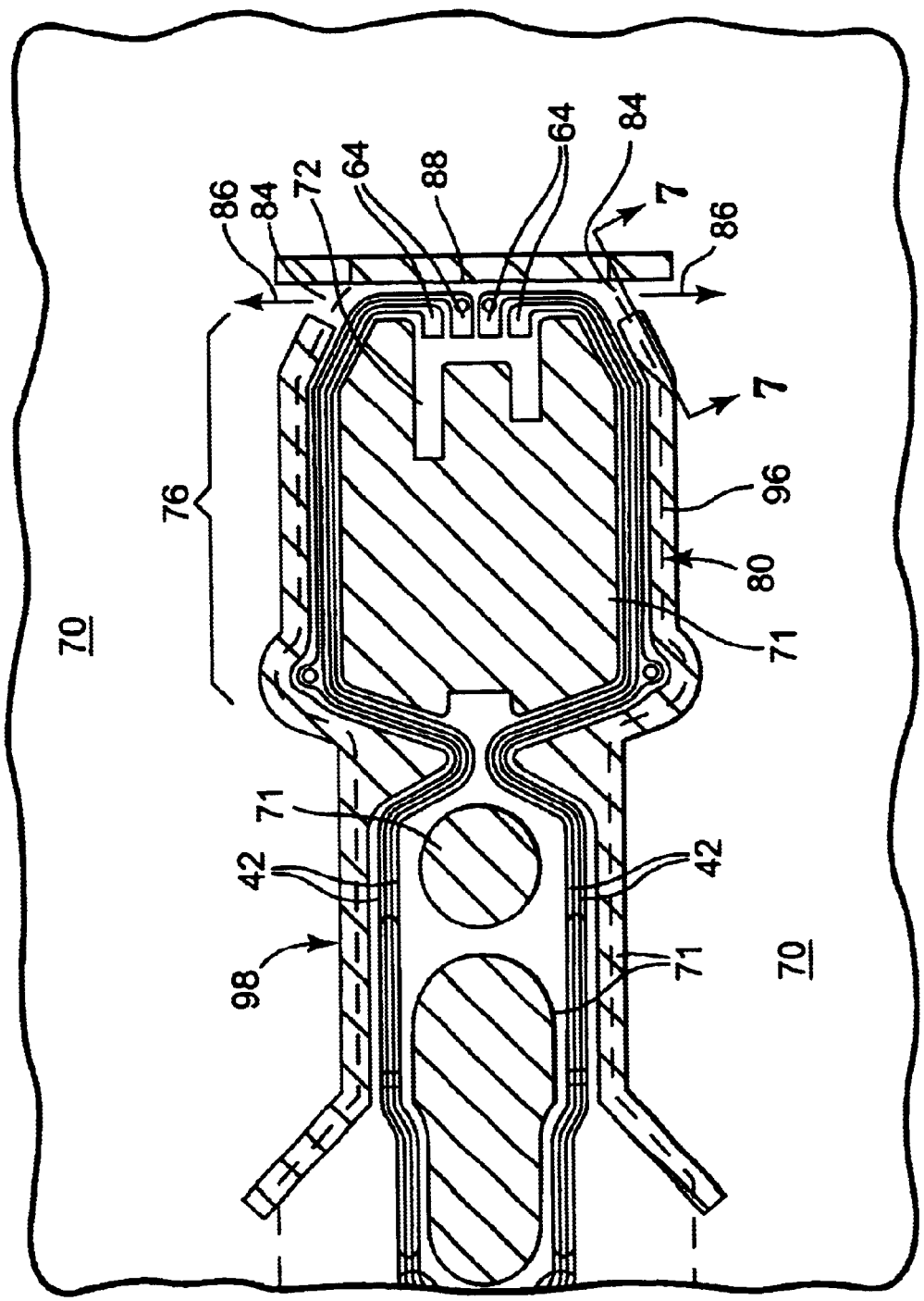
FIG. 6 is an enlarged top plan view of the gimbal region of an electrical interconnect in accord with the present invention as it appears before it is excised from the polyimide web.
Figure 7:
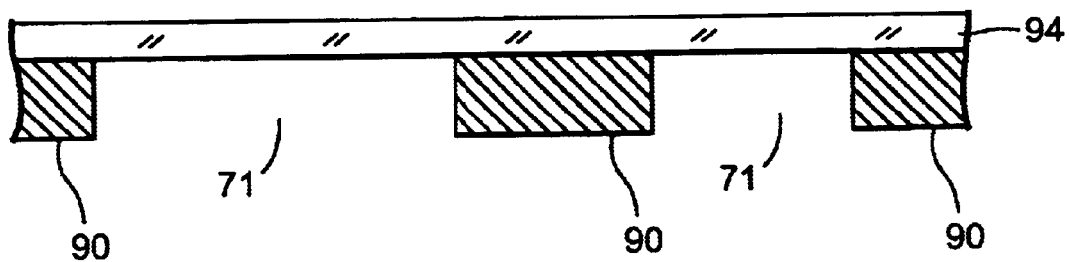
FIG. 7 is a partial cross sectional view taken along viewing plane 7—7 of FIG. 6.

Referring now to FIGS. 5, 6 and 7, the present invention will be described in broad detail. FIGS. 5 and 6 illustrate an enlarged top plan view of an electrical interconnect 36 as it appears near the end of the electrical interconnect 36 manufacturing process, with the electrical interconnect still supported by the web 70, and not yet blanked from the web 70. The cross-hatched areas in FIGS. 5 and 6 depict areas of the web 70 in which the polyimide has also been removed, thereby defining a hole through both surfaces of the web and the perimeter of the electrical interconnect 36. As discussed previously, the interconnect 36 includes one or more slider standoffs 72, which are the portions of the electrical interconnect 36 that are affixed to the flexure tongue 60 on a conventional head suspension assembly. The slider standoffs 72 should be planar with the rest of the electrical interconnect 36 so as not to significantly affect the static attitude of the head suspension to which it is attached.

FIG. 5 illustrates the manner in which electrical interconnects are commonly supported by the web 70 in today's electrical interconnect 36 manufacturing processes. Of most interest is the tip tab 74 which connects the gimbal portion 76 of the electrical interconnect 36 to the web 70. During the manufacturing process, tension on the web 70 results in corresponding tensioning of the electrical interconnect via the tip tab 74. The direction of the tensioning imparted by the tip tab 74 as indicated by arrow 78 is in the longitudinal direction of the electrical interconnect 36 and causes the interconnect gimbal arms 80 to be deformed, as illustrated by the dashed line 82, resulting in a condition in which the slider standoffs 72 are non-planar with the rest of the electrical interconnect 36. Additionally, the blanking process employed to excise the electrical interconnect 36 from the web 70, results in a similar tensioning of the tip tab 74, again resulting in non-planar slider standoffs 72 with respect to the rest of the electrical interconnect 36.

FIGS. 6 and 7 illustrate one embodiment of the current invention. Specifically, the electrical interconnect 36 is attached to the web 70 through two lateral in-line tabs, referred to as gimbal bar tabs 84. The gimbal bar tabs 84 are positioned on the gimbal portion 82 of the electrical interconnect 36 such that they are separated by a collinear continuous polyimide member 88. That is, the tabs 74 are connected by a substantially continuous portion or column of the substrate material such that the shearing force applied during the severing of the interconnect from the web is not borne by the gimbal arms 80 or slider standoffs 72. Stated otherwise, the tensioning of the gimbal bar tabs 84, which is indicated by arrows 86 in the lateral direction and which occurs during the electrical interconnect 36 manufacturing process and the blanking process, does not impart stresses into either the interconnect gimbal arms 80 or the slider standoffs 72. As a result, the deformation 82 which commonly occurs in the gimbal portion 76 of the electrical interconnect 36 during the manufacturing and blanking processes, is greatly minimized.

Figure 1:
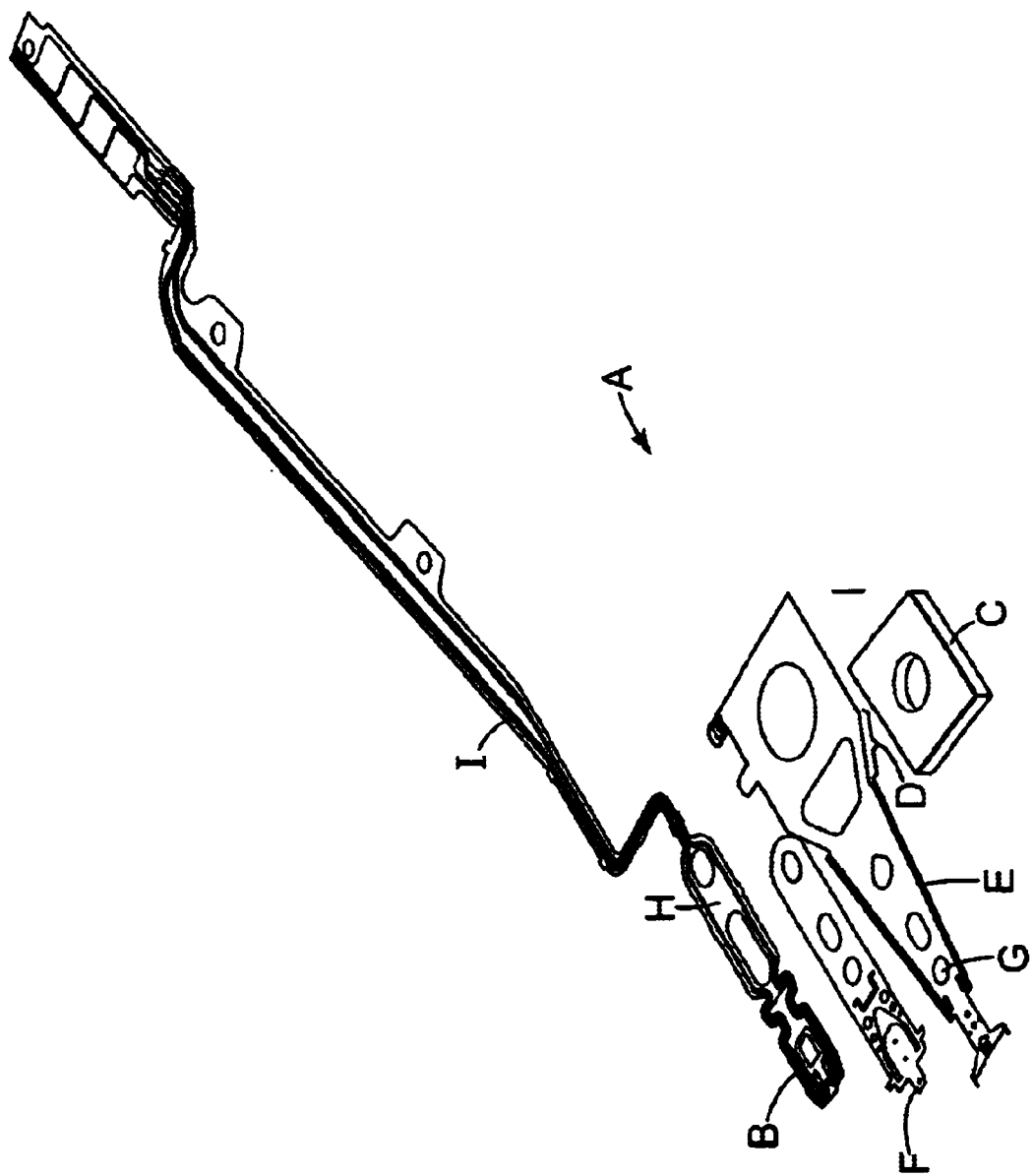
FIG. 1 is an illustrative, exploded, perspective view of a typical suspension/interconnect assembly.

Referring specifically to FIG. 7, it will be noted that the web 70 includes at least a bottom layer 90 made of synthetic material such as polyimide. This layer 90 supports a conductive layer 94 made of a conductive material such as copper. During manufacture of the interconnect 36, the conductive layer 94 is selectively removed according to the aforementioned known processes, resulting in the formation of the traces 42 being supported on the bottom layer 90, which forms the aforementioned substrate 40 of the interconnect. Further processing results in the removal of the supporting layer 90 in the cross-hatched areas 71 shown in FIGS. 5 and 6, thus leaving an interconnect blank connected to the web by the tension tabs 84. The interconnect blank 98 is then removed from the web 70 by known means. For example, the interconnect blank 98 shown in the Figure would be severed from the web substantially along the cutting line 96, thus forming an interconnect such as the interconnects shown in FIGS. 1 and 4. This severing process would sever the tension tabs 84.

Thus the present invention employs the use of opposing support tabs, separated by a collinear, substantially continuous member of polyimide to connect the gimbal region 76 of the electrical interconnect 36 to the web 70 during it's manufacturing processes.

Other modifications, alterations, or substitutions may now suggest themselves to those skilled in the art, all of which are within the spirit and scope of the present invention. For example, small holes or apertures could be present in the collinear section of polyimide separating the opposing tabs which attach the gimbal region of the electrical interconnect to the web. Additionally, rather than truly being collinear, the opposing tabs could be slightly misaligned, and still provide the same benefit (i.e. rather than a 180 degree included angle between the two tabs, an included angle of greater than 100 degrees would suffice).

And finally, the present invention as described herein is applicable to any variant of the components or elements such as, dual-layered interconnects, integrated gimbal products, microactuated products, "Femto" products, flex gimbals, and products intended to be used with a headlift.

The present invention having thus been described, other modifications, alterations, or substitutions may also now suggest themselves to those skilled in the art, all of which are within the spirit and scope of the present invention. It is therefore intended that the present invention be limited only by the scope of the attached claims below.

What is claimed is:

1. A method for improving a static attitude of head suspension assemblies with electrical interconnects including slider standoffs, said method comprising:

providing a web of interconnect material comprising at least a bottom layer of a synthetic material supporting a layer of conductive material;

selectively removing portions of said conductive material to form said electrical traces;

selectively removing portions of said bottom layer to form an interconnect blank;

providing a tension on said interconnect blank in a direction at an angle to a longitudinal axis of said interconnect blank; and severing said interconnect blank from said web;

wherein the tension exerted on said interconnect blank during said severing step improves the static attitude of head suspension assembly including said electrical interconnect by inhibiting the formation of non-planar slider standoffs.

2. The method of claim 1 wherein said tension is provided by selectively removing said bottom layer of material to provide a pair of tension tabs formed from said bottom layer and extending laterally from said interconnect blank, said tension tabs being connected by a substantially continuous column of bottom layer material.

3. The method of claim 2 wherein said tabs extend from said interconnect blank at substantially 180° C. relative to each other.

4. The method of claim 2 wherein said tabs extend from said interconnect blank at an angle relative to each other, wherein said angle lies substantially between 100° C. and 180° C.

5. The method of claim 1 wherein said tension is provided by selectively removing said bottom layer of material to provide a pair of tension tabs formed from said top layer and extending laterally from said interconnect blank, said tension tabs being connected by a substantially continuous column of bottom layer material.

6. The method of claim 5 wherein said tabs extend from said interconnect blank at substantially 180° C. relative to each other.

7. The method of claim 5 wherein said tabs extend from said interconnect blank at an angle relative to each other, wherein said angle lies substantially between 100° C. and 180° C.

8. A method for inhibiting a formation of non-planar slider standoffs in the manufacture of an electrical interconnect, said method comprising:

providing a web of interconnect material comprising at least a bottom layer of a synthetic material supporting a layer of conductive material;

selectively removing portions of said conductive material and said bottom layer of synthetic material to form an interconnect blank having a pair of gimbal arms and at least one slider standoff;

providing a tension on said interconnect blank in a direction at an angle to a longitudinal axis of said interconnect blank; and severing said interconnect blank from said web, wherein the tension exerted on said interconnect blank during said step of severing substantially prevents deformation of said gimbal arms and the formation of the non-planar slider standoffs.

* * * * *

UNITED STATES PATENT AND TRADEMARK OFFICE
CERTIFICATE OF CORRECTION

PATENT NO. : 6,751,843 B2
DATED : June 22, 2004
INVENTOR(S) : Mark T. Girard

It is certified that error appears in the above-identified patent and that said Letters Patent is hereby corrected as shown below:

<u>Column 8,</u>
Lines 19, 23, 24, 32, 36 and 37, delete "C.".

Signed and Sealed this

Fifth Day of October, 2004

JON W. DUDAS
*Director of the United States Patent and Trademark Office*